(12) United States Patent
Bivans et al.

(10) Patent No.: US 12,081,202 B2
(45) Date of Patent: Sep. 3, 2024

(54) FEEDBACK-DIVERSE, DUAL-CONTROLLER-ARCHITECTURE FUNCTIONAL SAFETY SYSTEM

(71) Applicant: Fort Robotics, Inc., Philadelphia, PA (US)

(72) Inventors: Nathan Bivans, Philadelphia, PA (US); Kerfegar Katrak, Philadelphia, PA (US)

(73) Assignee: Fort Robotics, Inc., Philadelphia, PA (US)

( * ) Notice: Subject to any disclaimer, the term of this patent is extended or adjusted under 35 U.S.C. 154(b) by 0 days.

(21) Appl. No.: 18/143,791

(22) Filed: May 5, 2023

(65) Prior Publication Data

US 2023/0361766 A1 Nov. 9, 2023

Related U.S. Application Data

(60) Provisional application No. 63/338,850, filed on May 5, 2022.

(51) Int. Cl.
*H03K 17/082* (2006.01)
*H03K 17/0812* (2006.01)

(52) U.S. Cl.
CPC ....... *H03K 17/082* (2013.01); *H03K 17/0812* (2013.01)

(58) Field of Classification Search
CPC ............ H03K 17/082; H03K 17/0812; H03K 2217/94104; H03K 17/941; G01V 8/20; H01H 2001/0005; H01H 9/167; H01H 2009/0083

USPC ......................................................... 327/427
See application file for complete search history.

(56) References Cited

U.S. PATENT DOCUMENTS

| | | | |
|---|---|---|---|
| 6,105,150 A | 8/2000 | Noguchi et al. | |
| 6,792,562 B1 | 9/2004 | Korhonen | |
| 8,204,712 B2 | 6/2012 | Katrak | |
| 8,874,818 B2 | 10/2014 | Felth et al. | |
| 11,086,336 B1 | 8/2021 | Bolotski et al. | |
| 11,127,295 B2 | 9/2021 | Radha et al. | |
| 11,372,796 B2 | 6/2022 | Culca et al. | |
| 11,455,223 B2 | 9/2022 | Nagy et al. | |
| 11,500,715 B1 * | 11/2022 | Katrak | G06F 11/0772 |
| 11,940,869 B2 * | 3/2024 | Katrak | G06F 11/0772 |
| 2004/0008467 A1 | 1/2004 | Calandre et al. | |
| 2004/0078116 A1 | 4/2004 | Hashimoto et al. | |
| 2004/0153786 A1 | 8/2004 | Johnson et al. | |
| 2004/0195916 A1 * | 10/2004 | Katrak | B60R 16/027 |
| | | | 307/4 |

(Continued)

FOREIGN PATENT DOCUMENTS

WO 2012122994 A1 9/2012
WO 2021178693 A1 9/2021

OTHER PUBLICATIONS

U.S. Appl. No. 17/332,635, filed May 27, 2021, Kerfegar Khurshed Katrak.

(Continued)

*Primary Examiner* — Ryan Jager
(74) *Attorney, Agent, or Firm* — Run8 Patent Group, LLC; Peter Miller; Brian T. Chew

(57) ABSTRACT

A feedback-diverse, dual-controller-architecture functional safety system includes: a first module; a second module; and an inter-module logic.

1 Claim, 1 Drawing Sheet

(56) References Cited

U.S. PATENT DOCUMENTS

| | | |
|---|---|---|
| 2005/0091501 A1 | 4/2005 | Osthoff et al. |
| 2006/0131963 A1* | 6/2006 | Katrak ................ B60K 31/047 |
| | | 307/134 |
| 2006/0145541 A1* | 7/2006 | Katrak ................... H01H 9/167 |
| | | 307/139 |
| 2006/0247872 A1 | 11/2006 | Boutin |
| 2007/0230627 A1 | 10/2007 | Veen et al. |
| 2008/0059867 A1 | 3/2008 | Lin et al. |
| 2009/0037776 A1 | 2/2009 | McAfee et al. |
| 2009/0043939 A1 | 2/2009 | Fuessl et al. |
| 2009/0055561 A1 | 2/2009 | Ritz et al. |
| 2009/0292951 A1 | 11/2009 | Fournier et al. |
| 2010/0234968 A1 | 9/2010 | Kurachi |
| 2011/0213984 A1 | 9/2011 | Orlando et al. |
| 2012/0086474 A1 | 4/2012 | Idiart |
| 2013/0094509 A1 | 4/2013 | Chen et al. |
| 2013/0145214 A1 | 6/2013 | Provencher et al. |
| 2013/0158776 A1 | 6/2013 | Rini et al. |
| 2014/0108896 A1 | 4/2014 | Jung |
| 2014/0244006 A1 | 8/2014 | Lee |
| 2014/0350725 A1 | 11/2014 | LaFary et al. |
| 2014/0372758 A1 | 12/2014 | Agiwal et al. |
| 2016/0127187 A1 | 5/2016 | Chen et al. |
| 2017/0024500 A1 | 1/2017 | Sebastian et al. |
| 2017/0098363 A1 | 4/2017 | Pickett et al. |
| 2018/0232270 A1 | 8/2018 | Otsuka et al. |
| 2018/0238490 A1 | 8/2018 | Hahn et al. |
| 2018/0329397 A1 | 11/2018 | Izzo et al. |
| 2019/0033358 A1 | 1/2019 | Katrak |
| 2019/0159237 A1 | 5/2019 | Wei et al. |
| 2019/0163558 A1 | 5/2019 | Tiedt et al. |
| 2019/0201136 A1 | 7/2019 | Shelton, IV et al. |
| 2019/0378610 A1 | 12/2019 | Barral et al. |
| 2020/0029343 A1 | 1/2020 | Wang et al. |
| 2020/0035087 A1 | 1/2020 | Teki et al. |
| 2020/0201336 A1 | 6/2020 | Myers et al. |
| 2020/0312155 A1 | 10/2020 | Kelkar et al. |
| 2021/0073098 A1 | 3/2021 | Maruyama |
| 2021/0105250 A1 | 4/2021 | Grinius et al. |
| 2021/0105346 A1 | 4/2021 | Pandey |
| 2021/0262848 A1 | 8/2021 | Hoferer |
| 2021/0282117 A1 | 9/2021 | Bivans |
| 2021/0291835 A1 | 9/2021 | Jalali et al. |
| 2021/0295703 A1 | 9/2021 | Jalali et al. |
| 2022/0382238 A1* | 12/2022 | Katrak ............... G05B 23/0235 |
| 2022/0382239 A1* | 12/2022 | Katrak ............... G05B 23/0237 |
| 2022/0382243 A1* | 12/2022 | Katrak ............... G05B 19/4142 |
| 2022/0382612 A1* | 12/2022 | Katrak ............... G06F 11/0751 |
| 2023/0050149 A1 | 2/2023 | Shimamura |
| 2023/0114984 A1* | 4/2023 | Katrak ................ G06F 11/0736 |
| | | 714/37 |
| 2023/0361766 A1* | 11/2023 | Bivans ................... H01H 9/167 |
| 2024/0028446 A1* | 1/2024 | Katrak ................ G06F 11/0751 |

OTHER PUBLICATIONS

U.S. Appl. No. 17/332,657, filed May 27, 2021, Kerfegar Khurshed Katrak.

U.S. Appl. No. 17/856,661, filed Jul. 1, 2022, Kerfegar Khurshed Katrak.

U.S. Appl. No. 17/856,700, filed Jul. 1, 2022, Kerfegar Khurshed Katrak.

Baee et al., "Broadcast Authentication in Latency-Critical Applications: On the Efficiency of IEEE 1609.2", IEEE, Dec. 2019, retrieved on [Mar. 7, 2022]. Retrieved from the internet entire document.

Final Office Action for U.S. Appl. No. 17/967,810 dated Aug. 3, 2023.

Non-Final Office Action for U.S. Appl. No. 17/332,635 dated Mar. 28, 2022.

Non-Final Office Action for U.S. Appl. No. 17/332,645 dated Oct. 21, 2022.

Non-Final Office Action for U.S. Appl. No. 17/332,652 dated Sep. 22, 2022.

Non-Final Office Action for U.S. Appl. No. 17/967,810 dated Mar. 6, 2023.

Notice of Allowance and Fees Due for U.S. Appl. No. 17/332,635 dated Jul. 15, 2022.

O'Dwyer. "Colour-Coded Batteries—Electro-Photonic Materials Circuitry for Enhanced Electrochemical Energy Storage and Optically Encoded Diagnostics." Jan. 19, 2016 (Jan. 19, 2016) Retrieved on Oct. 10, 2022 (Oct. 10, 2022) from entire document.

* cited by examiner

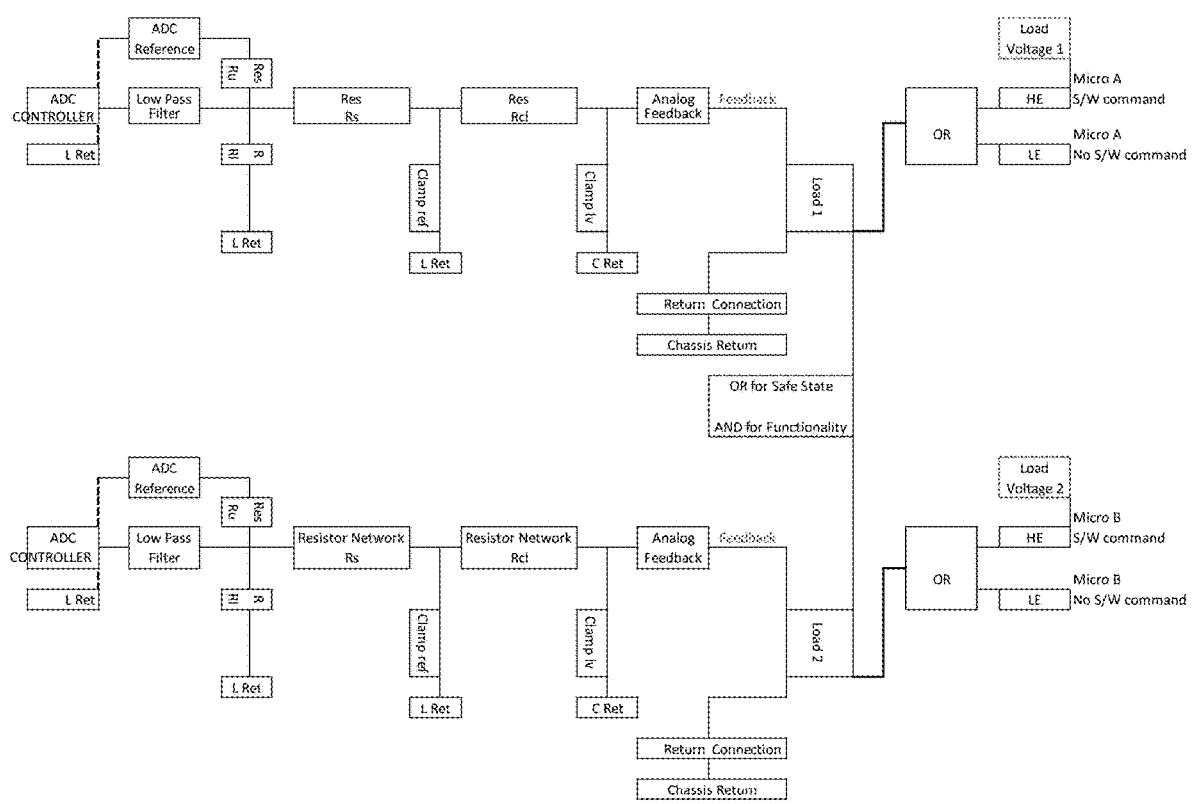

FEEDBACK-DIVERSE, DUAL-CONTROLLER-ARCHITECTURE FUNCTIONAL SAFETY SYSTEM

CROSS-REFERENCE TO RELATED APPLICATIONS

This application claims the benefit of U.S. Provisional Application No. 63/338,850, filed on 5 May 2022, which is incorporated in its entirety by this reference.

TECHNICAL FIELD

This invention relates generally to the field of functional safety and more specifically to a new and useful feedback-diverse, dual-controller-architecture functional safety system in the field of functional safety.

BRIEF DESCRIPTION OF THE FIGURES

FIG. 1 is a schematic representation of a system.

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. System

As shown in FIG. 1, a feedback-diverse, dual-controller-architecture functional safety system 100 includes: a first module; a second module; and an inter-module logic.

The first module includes: a load input pin and a chassis ground pin configured to couple to a load; a first clamper coupled to the load input pin and configured to suppress transient electrical voltages in a feedback signal inbound from the load to the load input pin; a second clamper coupled to the first clamper and configured to bound the feedback signal inbound, output by the first clamper, to within a logic voltage range; a voltage divider coupled to the second clamper; a first controller including a controller input pin coupled to the voltage divider; and an analog-to-digital converter interposed between the voltage divider and the first controller.

The voltage divider is configured to: shift a chassis power supply voltage at the load input pin, when the load operates in a functional state, to a first voltage range at the controller input pin; shift a null voltage at the load input pin, when the load operates in a safe state, to a second voltage range distinct from the first voltage range at the controller input pin; and set the controller input pin within a third voltage range, distinct from the first and second voltage ranges, responsive to a fault condition within the first module and at the load.

The ADC outputs a digital power supply signal representing a logic-side power supply voltage at the voltage divider relative to a logic ground.

The first controller: reads the digital power supply signal from the ADC; reads an input voltage value at the controller input pin; scales the input voltage value according to the digital power supply signal; converts the input voltage value into an encoded output value based on proximity of the input voltage value to the first voltage range, the second voltage range, and the third voltage range; and outputs the encoded output value to the inter-module logic.

The second module approximates the first module.

The inter-module logic: receives concurrent encoded output values from the first module and the second module; confirms function of the load function in response to the first and second encoded output values encoding a functional state corresponding to the first voltage range; outputs a safe state command in response to at least one of the first and second encoded output values encoding a safe state corresponding to the second voltage range; and outputs a fault command in response to at least one of the first and second encoded output values encoding a fault state corresponding to the third voltage range.

2. Applications

Generally, the system 100 includes: a pair of discrete, isolated modules that independently monitor the state of the same connected load (e.g., two redundant outputs of an emergency stop button, outputs of two redundant line break sensors) and that output encoded values representing functional, safe, and fault conditions of the load and system; and an inter-module logic that cross-checks concurrent encoded values output by these modules to validate functionality of the load, detect and handle safe state transitions (e.g., when the emergency stop button is depressed, when the line break sensors are triggered), and detect and handle faults (e.g., a short at the emergency stop button or line break sensors).

More specifically, the system 100 functions as a feedback-diverse, dual-controller-architecture functional safety system that cross-checks quaternary outputs from two modules to achieve high diagnostic coverage (e.g., >99% diagnostic coverage from two redundant channels, each contributing 90% diagnostic coverage).

2.1 Example: Emergency Stop Button

In one example, the system 100 is implemented in connection to paired outputs of an emergency stop (or "e-stop") button that includes: a single plunger; and two mechanical contacts connected to two e-stop button outputs that form two separate, discrete electrical circuits.

In this example, when the e-stop button is functional and not depressed, voltages output by the first and second circuits of the e-stop button are very similar or identical and fall in HI load voltage range. When the e-stop button is functional and depressed, the voltages output by the first and second circuits of the e-stop button are very similar or identical and fall in the LO voltage range. Furthermore, when the e-stop button is non-functional (e.g., damaged), voltages output by the first and second outputs of the e-stop button may differ and/or fall between the LO and HI voltage ranges.

In this example, the first output of the e-stop button is connected to the first input pin of the first module in the system 100, and the second output of the e-stop button is connected to the second input pin of the second module in the system 100.

The first controller, the second controller, and the inter-module logic can then cooperate, as described below, to generate and output cross-checked, hardware-diverse confirmation of the current functional state of the e-stop button based on voltages read from the two separate, discrete electrical circuits of the e-stop button.

2.2 Example: Optical Break Sensor

In another example, the system 100 is connected to outputs of a pair of line break (or "light curtain") sensors, such as including a common optical emitter, a first optical detector connected to a first output, and a second, independent optical detector connected to a second output. In this example, when the line break sensors are functional and the light curtain from the optical emitter to the line break sensors is uninterrupted, the voltages of the first and second outputs of the line break sensors may be very similar or identical and fall in HI voltage range. When the line break sensors are functional but the light curtain is interrupted, voltages of the first and second outputs of the line break sensor may be very similar or identical and fall in the LO voltage range; When either line break sensor is damaged, shorted, or otherwise non-functional, the voltages of the first and second outputs of the line break sensor may differ and/or fall between the LO and HI voltage ranges.

In this example, the first output of the line break sensor is connected to the first input of the first module in the system 100, and the second output of the line break sensor is connected to the second input of the second module in the system 100.

The first controller, the second controller, and the inter-module logic can then cooperate as described below to generate and output cross-checked, hardware-diverse confirmation of the current functional state of the light curtain based on voltages read from the line break sensors.

3. First Module

As described above, the first module includes: a load input pin; a chassis power supply pin; a chassis ground pin; a first clamper; a second clampers; a voltage divider; an ADC; and a first controller.

3.1 Load Input Pin

The load input pin is operable in: a HI-enable configuration in which the load sources current and operates within a nominal chassis power voltage range (e.g., 8 to 32 Volts) in a functional state; and a LO-enable configuration in which the load sinks current and operates near a nominal chassis ground voltage (e.g., 0 to 1.0 Volt) in a functional state.

3.2 Second Clamper

The first clamper: includes an input coupled to the load input pin; is coupled to chassis ground of the load via the chassis ground pin in the HI-enable configuration; is coupled to chassis power of the load via the chassis power supply pin in the LO-enable configuration; and clamps a feedback signal at the load input pin to within a first voltage range (e.g., 0 to 32 volts).

More specifically, the first clamper suppresses transient electrical voltages in the feedback signal—such as EMC conductor transients, load dump, and voltage spikes—inbound at the load input pin. In particular, the controller can output a clamped feedback signal constrained within the first voltage range.

3.3 Second Clamper

The second clamper: includes an input coupled to the output of the first clamper; is coupled to logic ground of the first module in the HI-enable configuration; is coupled to a logic power supply voltage of the first module in the LO-enable configuration; and clamps the clamped feedback signal output by the first clamper to within an operating voltage range of the first controller (e.g., 0 to 5 Volts). More specifically, the second clamper suppresses transient electrical voltages in the clamped feedback signal from the first clamper.

For example, a reference 0-Volt ground voltage of the chassis ground—connected to first clamper and to the load—may differ from the 0-Volt ground voltage of the first module or the first controller, such as if the load is exhibiting relatively high current draws or if a connection between the load or the module and the chassis exhibits a relatively high impedance. Therefore, the second clamper: connects to the logic ground of the first module rather than to the chassis ground of the load; and thus functions to suppress transient electrical voltages in the clamped feedback signal now in the logic voltage context of the first module.

3.4 Current-Limiting Resistor Network

In one variation, the first module also includes a current-limiting resistor network: including an input connected to the output of the second clamper; and configured to protect the first controller from current overruns in the feedback signal.

3.5 Voltage Divider

The voltage divider is coupled to the output of the current-limiting resistor network and is coupled to logic ground of the first module.

The voltage divider shifts the feedback signal up to a first controller input voltage range readable by the first controller as a functional state of the load, such as between 4.0 and 4.5 Volts given a connected and functional load in the HI-enable configuration or given a connected but disabled load in the LO-enable configuration. The voltage divider similarly pulls a null or near-zero voltage of the feedback signal up to a second, distinct controller input voltage range readable by the first controller as a load disabled state, such as between 1.0 and 1.5 Volts given a connected but disabled load in the HI-enable configuration or given a connected and functional load in the LO-enable configuration.

Accordingly the voltage divider outputs a voltage—within this controller input voltage range—to the controller.

3.6 Low-Pass Filter

In one variation, the first module also includes a low-pass filter: interposed between and coupled to the output of the voltage divider and the input pin of the controller; and configured to remove high-frequency transients from the feedback signal output by the voltage divider.

3.7 Analog-to-Digital Converter

The ADC functions as a reference voltage tracker. In particular, the ADC: is coupled to the logic power supply; and outputs a digital power supply signal—such as in the form of "counts"—that represents the real-time logic power supply voltage relative to logic ground. More specifically, the ADC returns a reference value (e.g., in counts) representing the logic power supply voltage to the controller.

3.8 First Controller

The first controller: is powered by the logic power supply; includes an analog input (e.g., "GPIO") pin connected to the output of low-pass filter; and includes a (digital) input that reads the digital power supply signal from the ADC.

During operation, the controller: reads and converts an analog voltage at the analog input pin into a set of input counts; reads a digital power supply signal from the ADC as a set of reference counts; corrects (e.g., scales) the input counts based on the set of reference counts to calculate a corrected input count; and encodes the corrected input count into a first encoded logic output value, such as described in U.S. patent application Ser. No. 17/332,635, which is incorporated in its entirety by this reference; and outputs the first logic output value to the inter-module logic.

The controller repeats this process over time, such as at a rate of 20 Hz.

4. Second Module

The second module: includes analogous (e.g., similar, identical) components arranged in an analogous format as the first module; and is separate and discrete from the first module.

5. Inter-Module Logic

The inter-module logic: is connected to outputs of the first and second controllers in the first and second modules, respectively; compares the first logic output value received from the first controller and the second logic output value received from the second controller to detect and verify the current state of the load, such as functional, disabled (or "safe state"), and fault; and outputs preconfigured commands according to the current state of the load.

In one implementation, the inter-module logic receives a pair of encodings from the first and second modules during a system cycle (e.g., once within a 50-millisecond interval). Then, if these two concurrent encodings (e.g., received within a threshold time offset of 20 milliseconds) encode for the same functional state of the load (and thus encode for the same or very similar voltages between 4 and 4.5 Volts detected by the first and second modules), the inter-module logic can cross-check these concurrent encodings to verify the current functional state of the load. Similarly, if these two concurrent encodings encode for the same safe state of the load (and thus encode for the same or very similar voltages between 1 and 1.5 Volts detected by the first and second modules), the inter-module logic can cross-check these concurrent encodings to verify the current safe state of the load. However, if these two concurrent encodings encode for different states of the load (and thus encode for different voltages) or if one or both of these encodings encodes for a fault state of the load (and thus encodes for detected input voltages outside of 1 to 1.5 Volts and 4.0 to 4.5 Volts), the inter-module logic can cross-check these concurrent encodings to verify the current fault state of the load.

Accordingly, the inter-module logic can then maintain a function state, output a command to enter or maintain a safe state, or output a command to enter or maintain a safe state with a fault flag—requiring fault investigation or reset before reentering the functional state—based on these cross-checked results of the encoded values received from the first and second modules.

6. Housing

In one variation, the first module, the second module, and the inter-module logic are arranged in a common housing.

7. Load Input Configuration

In one variation, the system 100 accesses a configuration that defines load connection enable settings and fault, safe, and functional states of the load as a function of voltage read by controllers in the system 100.

For example, the first and second modules can be configured in: a first HI-LO configuration in which the first module is HI-enabled and the second module is LO-enabled; a second HI-HI configuration in which the first module is HI-enabled and the second module is HI-enabled; or a third LO-LO configuration in which the first module is LO-enabled and the second module is LO-enabled.

Furthermore, the first controller in the first module can be configured to output different encoded values—representing functional, safe, and fault states of the load and system—based on the configuration of the first module and operation characteristics of the load and the first module. The second controller in the second module can be separately configured based on the configuration of the second module and operation characteristics of the load and the second module.

7.1 Reconfiguration

In one variation, the first module also includes a set of configuration switches (e.g., transistors or relays): controlled by the first controller; and configured to transition components of the first module between HI-enable and LO-enable configurations.

For example, the system 100 can include: a first configuration switch coupled to the first clamp and configured to selectively couple the first clamp to a load reference voltage in a first state and a chassis ground in a second state; a second configuration switch coupled to the second clamp and configured to selectively couple the second clamp to a logic reference voltage in a first state and a logic ground in a second state; and a third configuration switch coupled to the voltage divider and configured to selectively couple the voltage divider to the logic reference voltage in a first state and the logic ground in a second state.

Therefore, the system 100 can: set these configuration switches (e.g., via a "software command") to their first states to transition the first module into a LO-enable configuration; and set these configuration switches to their second states to transition the first module into a HI-enable configuration.

For example, the system 100 can also include an enable configuration selector (e.g., a mechanical switch) arranged on the housing, operable in a first position labeled as LO-enable, and operable in a second position labeled as HI-enable. In this example, the system 100 can: read a position of the enable configuration selector; and set the configuration switches to either their first or second states based on the position of the enable configuration selector.

Alternatively, the first module: can include both HI-enable and LO-enable circuits between the first load input pin and the first controller; and can selectively activate and connect these circuits to the first controller based on the configuration.

Yet, alternatively, the system 100: can include an FPGA; can reconfigure a first region of the FPGA to represent the first module according to a loaded configuration, such as by flashing the FPGA with new firmware based on the configuration; and can similarly reconfigure a second region of the FPGA to represent the second module according to this configuration.

8. Circuit Operation, First Module, HI-Enable Configuration

During operation, the first and second modules can independently monitor the load and return encoded values—representing the load as detected independently by the modules—to the inter-module logic for fusion and cross-checking.

In one implementation, an operator sets the first and second modules in the HI-HI configuration described above (e.g., with the configuration switches described above set to their second states, thereby connecting the first clamper to chassis ground and connecting the second clamper and the voltage divider to logic ground in each module). The operator then connects a first output of the load to a first load input pin of the first module; connects a second output of the load to a second load input pin of the second module; connects the load chassis to the load ground pin of the system 100; and activates the system 100.

9.1 Load Enabled: Functional State

In this implementation in which the first module operates in the HI-enable configuration, if the load is connected to the load input of the first module and is functional: voltage of the feedback signal at the load input pin of the first module may fall between 8 and 32 Volts; the first clamper in the first module clamps the feedback signal below 32 Volts; the second clamper in the first module clamps the feedback signal output by the first clamps below 5V; the voltage divider outputs a voltage between 3.5 and 4 Volts; and the output of voltage divider thus falls within the voltage range that the first controller is configured to read as a functional load.

More specifically, in this implementation, the first controller is preloaded with: a functional controller input voltage range between 3.5 and 4.0 Volts that corresponds to a functional state of the load; and a corresponding encoded value. Accordingly, the first controller encodes the controller input voltage in a first encoded "functional" value and returns this first encoded "functional" value to the inter-module logic.

The second module similarly executes this process to return a second encoded "functional" value to the inter-module logic (i.e., in the absence of short or other fault within the second module or the load).

The inter-module logic then combines the first and second encoded "functional" values into a cross-checked, hardware-diverse confirmation of the current functional state of the load and the system 100. More specifically, if the inter-module logic receives both the first and second encoded values from the first and second modules within a time interval (e.g., 50 milliseconds), and if the first and second encoded values both represent functional states detected by the first and second modules, respectively, the inter-module logic can interpret these conditions as: the load is connected to both the first and second load input pins of the first and second modules; the voltage of the feedback signals at the first and second load input pins are substantially similar or identical; logic and circuits within the first and second module are sufficiently similar in function and result; voltages at the load input pins indicate that the load is functional; etc.

Therefore, the inter-module logic can interpret the first and second encoded "functional" values as: a load is connected; the load is functional; an external fault at the load is not currently present; the first and second modules are functional; and an internal fault at the first and second modules is not currently present.

Based on its configuration, the inter-module logic can then: interpret the first and second encoded "functional" values as a cross-checked, hardware-diverse confirmation of the current functional state of the load and the system 100; make no change to operation of the load; and/or write cross-checked, hardware-diverse confirmation of the current functional state of the load and a timestamp to a load operation audit file.

9.2 Load Disabled: Safe State

Conversely, if the load is connected but disabled in the HI-enable configuration, the voltage of the feedback signal at the first input pin of the first module may fall within a null input voltage range between 0 and 1.0 Volt; if load is disabled, the load voltage may fall between 0V and 1V; the first and second clampers may minimally affect this feedback signal; voltage into the voltage divider may fall between 0 and 1.0 Volt; and the voltage divider may pull this null input voltage up to a discrete, nominal voltage range—associated with a safe state by the first controller—between 1.0 and 1.5 Volts.

More specifically, in this condition, the first controller can read a first input voltage between 1.0 volts and 1.5 Volts from the first low-pass filter. The first controller is preloaded with a definition of "safe state" for controller input voltages between 1.0 and 1.5 Volts. Accordingly, the first controller: encodes this controller input voltage in a first encoded "disabled" value and returns the first encoded "disabled" value to the inter-module logic.

The second module similarly executes this process to return a second encoded "disabled" value to the inter-module logic.

The inter-module logic then combines the first and second encoded "disabled" values into a cross-checked, hardware-diverse confirmation of the current disabled state of the load and the system 100. More specifically, if the inter-module logic receives both the first and second encoded values from the first and second modules within a time interval (e.g., 50 milliseconds), and if the first and second encoded values both represent disabled states detected by the first and second modules, respectively, the inter-module logic can interpret these conditions as: the load is connected to both the first and second load input pins of the first and second modules; the load inputs at the first and second load input pins are substantially similar or identical; logic and circuits within the first and second module are substantially similar or identical in function; and voltages at the load indicate that the load is disabled.

Therefore, the inter-module logic can interpret the first and second encoded "disabled" values as: a load is connected; the load is disabled; an external fault at the load is not currently present; the first and second modules are functional; and an internal fault at the first and second modules is not currently present.

Based on its configuration, the inter-module logic can then: interpret the first and second encoded "disabled"

values as a cross-checked, hardware-diverse confirmation of the current disabled state of the load and the system 100; output a command to enter or maintain a "safe state"; and write cross-checked, hardware-diverse confirmation of the current functional state of the load and a timestamp to a load operation audit file.

9.3 Load Out of Range: Fault

Furthermore, in the presence of an internal or external fault: the encoded values output by the first and second module may indicate dissimilar states; voltages read by one or both of the first and second controllers may fall outside of the functional and disabled voltage ranges; and one or both of the first and second controllers may output an encoded value other than encoded "functional" or "disabled" values. More specifically, in the presence of an internal or external fault, the input voltage read by the first controller may fall outside of the "functional state" voltage range between 3.5 and 4.0 Volts and the "safe state" voltage range between 1.0 and 1.5 Volts.

For example, various conditions at the system 100 and/or the load may yield a fault state, such as: a short at the load, between the load and the first module, or within the first module itself that drives the voltage output of the voltage divider in the first module below 1.0V; absence of a load connected to the input pin of the first module (i.e., a "disconnected load") and the resulting floating state of the input pin that yields voltage outputs—from the voltage divider in the first module—that vary between 1.8 and 1.9 Volts; and/or internal damage to the first module or the system 100 more generally that similarly yields voltage outputs—from the voltage divider in the first module below—that fall outside of the "functional state" voltage range between 3.5 and 4.0 Volts and the "safe state" voltage range between 1.0 and 1.5 Volts.

As described above, the first controller reads an input voltage from the first low-pass filter. In response to reading a voltage outside of the "functional state" and "safe state" voltage ranges, the first controller: detects a fault; encodes this input voltage in an encoded "fault" value; and returns this first encoded "fault" value to the inter-module logic.

The second module concurrently executes this process.

If the fault detected by the first module is external to the system 100, the second module may concurrently return a second encoded "fault" value to the inter-module logic. If the fault detected by the first module is internal to the first module, the second module may concurrently return a second encoded "functional" or "disabled" value to the inter-module logic, as described above.

9.3.1 Fault: After Startup

The inter-module logic then combines the first and second encoded values into a cross-checked, hardware-diverse confirmation of the current fault state of the load and the system 100. More specifically, if either of the first and second encoded values received from the first and second modules indicates a fault state detected by the first and/or second modules, the inter-module logic can: detect a fault condition; interpret receipt of an encoded "fault" value as a cross-checked, hardware-diverse confirmation of a current fault state of the load and the system 100; output a command to enter or maintain a "safe state with fault"; and/or write cross-checked, hardware-diverse confirmation of the current fault state of the load and system and a timestamp to a load operation audit file.

The inter-module logic can similarly detect and respond to a fault if the concurrent encoded values received from the first and second modules differ, such as in response to receipt of an encoded functional value from the first module and an encoded disabled value from the second module.

9.3.2 Load Disconnected at Startup

In the foregoing implementation, if the inter-module logic received an encoded "fault" value from the first module at startup (i.e., when the system 100 is switched to an "ON" state), the inter-module logic can: predict failure to connect the load to the first input of the module; implement methods and techniques described above to output a safety state command—rather than a fault command; and output or otherwise trigger a prompt to connect the load to the first input at the first module.

In this implementation, once a user correctly connects the load to the first input pin at the first module, the first controller can: detect a voltage input within the functional voltage range; and return an encoded functional value to the inter-module logic. If the inter-module logic receives an encoded functional value from both the first and second modules within a threshold time interval, the inter-module logic can implement methods and techniques described above to: identify the load as connected and functional; interpret the first and second encoded "functional" values as a cross-checked, hardware-diverse confirmation of the current functional and connected state of the load and the system 100; output a command to enter a functional state; and write cross-checked, hardware-diverse confirmation of the current functional and connected state of the load and a timestamp to a load operation audit file.

More specifically, in this implementation, an operator may unintentionally neglect to connect a load when starting up the system 100, which may trigger either or both modules in the system 100 to output an encoded fault value to the inter-module logic. However, rather than trigger a fault and prompt investigation into the fault before clearing the fault and permitting transition to a functional state, the inter-module logic can instead: set a startup flag when the system 100 is first activated; trigger output of a prompt to connect a load responsive to receipt of an encoded fault value if the startup flag is set; and then clear the startup flag and output a command to enter the functional state upon subsequent receipt of encoded functional values from the first and second modules. Therefore, in this implementation, the controller can enable the operator to quickly recover from failure to timely connect the load to the system 100 at system startup.

10. Module-Level Readback

In one variation, an internal register within the first controller of the first module is set to read states of output pins of the first controller. In one example, paired sets of input and output pins of the first controller are bridged—outside of the first controller—and the set of input pins reads states of the output pins in the first controller. In another example, the paired sets of input and output pins of the first controller are connected internally within the first controller.

In this variation, the first module: implements methods and techniques to encode a value based on the voltage of an input feedback signal read from the voltage divider; outputs a command—according to the encoded value—to the inter-module logic via the set of output pins; reads a concurrent sequence of readback values from the set of input pins; and compares the sequence of readback values to the encoded value. In this variation, if the sequence of readback values and the encoded value are identical, the controller confirms output of the first controller and detects no further fault within the first controller. However, if the sequence of readback values and the encoded value differ, the first controller can: detect a possible fault in the first controller; and/or output an encoded "fault" value to the inter-module logic, such as a generic encoded fault value or a predefined encoded fault value associated with a readback error. The inter-module logic can then transition to a fault state and prompt or initiate troubleshooting readback errors at the first module.

In this variation, the second module can independently execute similar methods and techniques.

10.1 Inter-Module Logic Readback

In a similar variation, the system 100: sets an internal register within inter-module logic to read output pins of the inter-module logic. In this variation, the inter-module logic: implements methods and techniques described above to output a command for functional, safety, or fault states; reads a concurrent sequence of readback values from the set of input pins; and compares the sequence of readback values to the command. In this variation, if the sequence of readback values and the command are identical, the inter-module logic can confirm output of the first controller and detect no further fault. However, if the sequence of readback values and the command differ, the inter-module logic can: detect possible fault in the system 100; and output "fault" command.

As a person skilled in the art will recognize from the previous detailed description and from the figures and claims, modifications and changes can be made to the embodiments of the invention without departing from the scope of this invention as defined in the following claims.

We claim:

1. A feedback-diverse, dual-controller-architecture functional safety system comprising:
   a first module comprising:
   a load input pin and a chassis ground pin configured to couple to a load;
   a first clamper coupled to the load input pin and configured to suppress transient electrical voltages in a feedback signal inbound from the load to the load input pin; a second clamper coupled to the first clamper and configured to bound the feedback signal inbound, output by the first clamper, to within a logic voltage range;
   a voltage divider coupled to the second clamper, the voltage divider configured to:
   shift a chassis power supply voltage at the load input pin, when the load operates in a functional state, to a first voltage range at a controller input pin;
   shift a null voltage at the load input pin, when the load operates in a safe state, to a second voltage range distinct from the first voltage range at the controller input pin; and
   set the controller input pin within a third voltage range, distinct from the first and second voltage ranges, responsive to a fault condition within the first module and at the load;
   a first controller including the controller input pin coupled to the voltage divider and configured to:
   read a digital power supply signal from an analog-to-digital converter;
   read an input voltage value at the controller input pin;
   scale the input voltage value according to the digital power supply signal;
   convert the input voltage value into an encoded output value based on proximity of the input voltage value to the first voltage range, the second voltage range, and the third voltage range; and
   output the encoded output value to the inter-module logic; and
   the analog-to-digital converter interposed between the voltage divider and the first controller, the analog-to-digital converter configured to output the digital power supply signal representing a logic-side power supply voltage at the voltage divider relative to a logic ground;
   a second module that approximates the first module; and
   the inter-module logic configured to:
   receives concurrent encoded output values from the first module and the second module;
   confirm function of the load function in response to the first and second encoded output values encoding a functional state corresponding to the first voltage range;
   output a safe state command in response to at least one of the first and second encoded output values encoding a safe state corresponding to the second voltage range; and
   output a fault command in response to at least one of the first and second encoded output values encoding a fault state corresponding to the third voltage range.

* * * * *